United States Patent [19]
Roy

[11] Patent Number: 5,808,487
[45] Date of Patent: Sep. 15, 1998

[54] MULTI-DIRECTIONAL SMALL SIGNAL TRANSCEIVER/REPEATER

[75] Inventor: Richard Stephen Roy, Danville, Calif.

[73] Assignee: Hitachi Micro Systems, Inc., San Jose, Calif.

[21] Appl. No.: 756,050

[22] Filed: Nov. 26, 1996

Related U.S. Application Data

[63] Continuation of Ser. No. 346,694, Nov. 30, 1994, abandoned.

[51] Int. Cl.$^6$ ........................................ H03K 19/00
[52] U.S. Cl. ...................... 327/55; 327/57; 365/230.05; 365/207
[58] Field of Search ................... 327/51, 52, 55, 327/57, 215; 365/189.02, 189.05, 205, 230.05, 207, 208

[56] References Cited

U.S. PATENT DOCUMENTS

| | | | |
|---|---|---|---|
| 4,290,120 | 9/1981 | Stein | 365/205 |
| 4,361,869 | 11/1982 | Johnson et al. | 364/200 |
| 4,697,112 | 9/1987 | Ohtani et al. | 365/205 |
| 4,833,648 | 5/1989 | Scharrer et al. | 365/230.05 |
| 4,843,264 | 6/1989 | Galbraith . | |
| 5,036,231 | 7/1991 | Kanbara | 327/55 |
| 5,081,575 | 1/1992 | Hiller et al. | 395/325 |
| 5,099,452 | 3/1992 | Yamakoshi et al. | 365/230.05 |
| 5,261,064 | 11/1993 | Wyland | 395/400 |
| 5,282,174 | 1/1994 | Little | 365/230.05 |
| 5,299,156 | 3/1994 | Jiang et al. | 365/230.05 |
| 5,355,391 | 10/1994 | Horowitz et al. | 375/36 |
| 5,388,237 | 2/1995 | Sodos | 395/425 |
| 5,434,818 | 7/1995 | Byers et al. | 365/189.04 |
| 5,440,523 | 8/1995 | Joffe | 365/230.05 |
| 5,452,436 | 9/1995 | Arai et al. | 395/550 |
| 5,481,496 | 1/1996 | Kobayashi et al. | 365/230.05 |
| 5,542,067 | 7/1996 | Chappell et al. | 395/494 |

FOREIGN PATENT DOCUMENTS 62-180582 8/1987 Japan .

OTHER PUBLICATIONS

New Product Review: ICs BIT Rifles 8nSec Multiported Memories Semiconductor Industry & Business Survey, HTE Research, Inc., v. 11, No. 16 Nov. 13, 1989.

VTI Enters Special Memory Market, Electronic Engineering Times, p. 34, Aug. 12, 1985.

*Primary Examiner*—Timothy P. Callahan
*Assistant Examiner*—Jung Ho Kim
*Attorney, Agent, or Firm*—Graham & James LLP

[57] ABSTRACT

A signal transfer circuit for enabling rapids transfer of differential electrical signals among multiple signal paths is provided. The circuit comprises first and second pairs of signal transfer terminals, a pair of internal nodes, first and second pairs of isolation devices, a differential signal amplifier, a gain-enhancing cross-coupled pair of devices, and a precharge circuit. The first and second pairs of isolation devices are of a single device type and are coupled between respective ones of the signal transfer terminal pairs and the internal node pair. The isolation devices each have a control terminal for receiving an isolation control signal. The differential signal amplifier circuit is coupled to the internal nodes, and is comprised of complementary device types. The amplifier circuit has a control terminal for receiving an amplifier control signal for enabling the amplifier circuit. The gain-enhancing cross-coupled pair of devices are gated by the internal nodes and drive the transfer terminals directly. The precharge circuit is coupled to the pair of internal nodes and has a control terminal for receiving an internal precharge control signal. A differential signal applied to one of the pair of transfer signal terminals is transferred to the internal nodes for amplification by the differential amplifier circuit, and after which the amplified differential signal on the internal nodes is transferred without inversion to a different pair of transfer signal terminals.

43 Claims, 6 Drawing Sheets ly designed MULTI-DIRECTIONAL SMALL SIGNAL TRANSCEIVER/REPEATER

This application is a continuation under 37 C.F.R. § 1.62 of prior application Ser. No. 08/346,694 filed Nov. 30, 1994 for "MULTI-DIRECTIONAL SMALL SIGNAL TRANSCEIVER/REPREATER", now abandoned.

BACKGROUND OF THE INVENTION

1. Field of the Invention

The present invention relates to the transferring of data signals across relatively long distances internal to an integrated circuit, and more particularly, to a CMOS circuit that enables the sensing of a small, differential voltage input signal and provides a high current, differential signal on one or more outputs.

2. Description of Related Art

Electronic systems typically rely upon the transmission of data signals between respective circuit elements as a fundamental aspect of their operation. Within a single integrated circuit, such as a microprocessor, signals are often transmitted along a central data bus that can extend over long internal distances between the discrete units contained in the integrated circuit. For example, a microprocessor may have a data bus that interconnects internal units such as an instruction decode unit, a floating point unit, a memory management unit, a graphics unit, etc., and individual data signals are transmitted between the internal units along the data bus. Signals are routed along the data bus between the internal units by the use of precise timing signals that enable desired ones of the units to receive the particular signals.

An individual data signal representing a single unit of information, or data bit, may be transmitted along a single data line of the bus. The voltage of the signal on the data line ranges between $V_{DD}$ and $V_{SS}$, where $V_{DD}$ represents the positive power supply voltage level and $V_{SS}$ represents the ground voltage level. These boundary voltage levels $V_{DD}$ and $V_{SS}$, known as the rail voltages, determine the state of the data bit being transmitted. Alternatively, the data signal can be transmitted along a pair of lines with the data state represented by a differential voltage between the line pair. The differential voltage is a fraction of the full rail voltage, such as 300 millivolts with respect to a typical CMOS 3.3 volt $V_{DD}$ full rail voltage level. The DC bias voltage of the line pair could range between $V_{DD}$ and $V_{SS}$, and many different bias voltage levels have been utilized depending on the particular requirements of the previous circuits. A first data state (such as a data "0") may be represented by a first polarity differential, and a second data state (such as a data "1") represented by an opposite polarity differential.

Under certain circumstances, the use of differential signal transmission may be preferred over full rail voltage signal transmission since it requires substantially less AC power. The AC power on a data line is defined by the relation $CV^2f$, where C is the capacitance of the data line, V is the voltage swing, and f is the frequency. Accordingly, the AC power necessary to charge the data line to the differential voltage level is substantially less than that required to charge the data line to full rail voltage level. Notwithstanding this significant benefit, there are drawbacks with the use of differential signal transmission associated with the sensing of the small voltage level, such as high DC power and precise timing requirements.

Within data lines that operate in one direction only, referred to herein as unidirectional data lines, it is possible to partition the line and insert a repeater element at the partition point. The repeater element would detect the presence of a small signal on the line and re-transmit the signal at a substantially amplified current level. Various techniques have been developed within the prior art to sense and amplify small signals within unidirectional data lines; however, none of these techniques are capable of providing a repeater acceptable for high speed multidirectional operation.

One such technique involves the use of a DC operational amplifier, or op-amp. The op-amp produces an output signal that is an amplified version of a differential input signal. An advantage of this technique is that a precisely timed clock signal is not required to enable the op-amp; instead, the output simply follows the input after a short time lag. At the same time, however, the op-amp draws relatively high DC power levels since it is operating continuously. The DC power requirement can be reduced substantially by use of clocked op-amps which only draw DC power during the time they are enabled by a clock signal that notifies the op-amp of the arrival of an input. Accordingly, precise timing signals are necessary for efficient operation of the clocked op-amps. Despite this improvement over conventional op-amps, the clocked op-amps remain unsatisfactory as sense amplifiers since they draw high DC power during the time they are enabled, introduce unacceptable signal delays into the signal path, and require relatively large amounts of physical space within the integrated circuit.

Another technique for sensing and amplifying small signals was developed for accessing random access memory (RAM) devices. RAM devices, such as static RAMs (SRAMs), have a small memory cell with small average drive capability. During a memory access cycle, the memory cells transfer a small differential voltage signal onto a bitline. Sense amplifiers detect the small differential voltage and produce a full rail voltage output representative of the data state of the RAM device. An example of a sense amplifier of this type is disclosed in U.S. Pat. No. 4,843,264, to Galbraith for DYNAMIC SENSE AMPLIFIER FOR CMOS STATIC RAM, which discloses the use of an isolated latching circuit comprising cross-coupled FETs. The differential voltage signal is detected at gates of sensing transistors. The sense amplifiers of the type disclosed by Galbraith are not acceptable as multidirectional data bus repeaters since they are only capable of operating in one direction, and the configuration of the gate input and full rail voltage output cannot be reversed in order to transmit a signal in an opposite direction.

Unfortunately, the typical multidirectional internal data bus cannot be easily subdivided to utilize the conventional repeater techniques associated with unidirectional data lines. Implementing a central repeater with prior art techniques to service multiple sources and destinations would be very costly in terms of physical area and complexity, since a separate unidirectional repeater circuit would be required for every possible direction that a data signal could travel. Since it is not practical to implement unidirectional repeater techniques in a multidirectional data bus, the high resistance and capacitance of the data bus becomes a significant speed-limiting bottleneck to high speed integrated circuit operation. In the worst case, such a data bus within a large microprocessor may introduce a signal delay of as much as several nanoseconds, which is becoming unacceptable for many commercial applications requiring very high data rates. The current industry trend toward increasing data bus size will only exacerbate this problem.

Accordingly, a critical need exists for a small signal repeater capable of multidirectional operation. The repeater must be capable of receiving a differential input signal, and producing one or more differential output signals. Moreover, the repeater must be able to operate at very high speed, and draw low DC current levels. Finally, the repeater must be capable of implementation with CMOS devices for compatibility with existing microprocessor design and require a relatively small amount of space on an integrated circuit.

SUMMARY OF THE INVENTION

In accordance with the teachings of the present invention, a signal transfer circuit for enabling rapid transfer of differential electrical signals among multiple signal paths is provided.

The signal transfer circuit comprises a plurality of pairs of signal transfer terminals, a pair of internal nodes, a plurality of isolation devices, a differential signal amplifier, and a plurality of pairs of gain enhancement devices. The isolation devices are of a single device type, and are each associated with respective ones of the signal transfer terminal pairs. The isolation devices are coupled between the respective signal transfer terminal pairs and the internal node pair. The isolation devices each have a control terminal for receiving an isolation control signal. The differential signal amplifier circuit is coupled to the internal nodes. The amplifier circuit has a control terminal for receiving an amplifier control signal for enabling the amplifier circuit. The gain enhancement devices have gates cross coupled to the internal nodes. The signal transfer circuit further comprises a precharge circuit coupled to the internal nodes and a control terminal for receiving an internal precharge control signal.

A differential input signal applied to one of the pair of transfer signal terminals is transferred to the internal nodes for amplification by the differential amplifier circuit, and after which the amplified differential signal on the internal nodes is transferred to one or more pairs of transfer signal terminals. In particular, the internal nodes of the signal transfer circuit are precharged to a full rail voltage level to prepare the circuit for receipt of a differential input signal. Next, a first pair of the transfer terminals is enabled to allow the differential input signal to propagate to the internal nodes, and the differential input signal latches onto the internal nodes by use of the differential signal amplifier. The first pair of transfer terminals is then disabled, isolating the first pair of transfer terminals from the internal nodes, and at least one pair of transfer terminals is enabled to propagate the latched differential input signal as an output signal from the internal nodes to the other pair or pairs of transfer terminals. The cross coupled gain enhancement devices increase the rate at which the differential input signal is generated on the output terminals by severely limiting the droop of the high-remaining differential output node. While an input signal is typically transferred through the signal transfer circuit from one pair of transfer terminals to one or more other pairs of transfer terminals, the input signal could merely return to the original pair of transfer terminals for use as a local amplifier.

The signal transfer circuit of the present invention is capable of operating as a repeater, a small signal receiver and/or a small signal transmitter. As a repeater, the signal transfer circuit receives a differential electrical signal at a first pair of transfer terminals, and transmits a differential electrical signal at one or more other transfer terminals. Any of the transfer terminals are capable of receiving or transmitting the differential electrical signals, providing the signal transfer circuit with bidirectional and multidirectional capability. As a small signal receiver, the signal transfer circuit receives a differential electrical signal at a first pair of transfer terminals, and transmits a full rail voltage output signal at one or more other transfer terminals. The generation of an adequately large output signal may require the addition of an opposite device type in parallel with the output isolation devices. As a small signal transmitter, the signal transfer circuit can receive a full rail voltage, single-ended input signal at one transfer terminal, and transmit a differential electrical signal at one or more other transfer terminals, with no modification of the circuit structure.

In an embodiment of the present invention, a multidirectional data bus having a plurality of differential data line pairs is provided with at least two of the signal transfer circuits for enabling transfer of differential electrical signals among the differential data line pairs. Each of the signal transfer circuits has an associated control circuit that generates timing signals to control operation of the associated signal transfer circuit. The control circuit also controls the precharging of the differential data line pairs prior to transfer of the differential electrical signals between adjacent ones of the signal transfer circuits. The signal transfer circuits utilized in the multidirectional data bus can be selectively configured as repeaters, receivers and/or transmitters.

A more complete understanding of the multidirectional small signal transceiver/repeater will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

A first aspect of the present invention provides a small signal repeater capable of multidirectional operation which overcomes the deficiencies of the prior art. The repeater can receive a differential input signal, and produce one or more differential output signals. The repeater can operate at very high speed, and draw virtually no DC current. Finally, the repeater can be implemented with CMOS devices and would require a relatively small amount of space on an integrated circuit, compared with prior art implementations of amplifier or repeater circuits.

Figure 1:
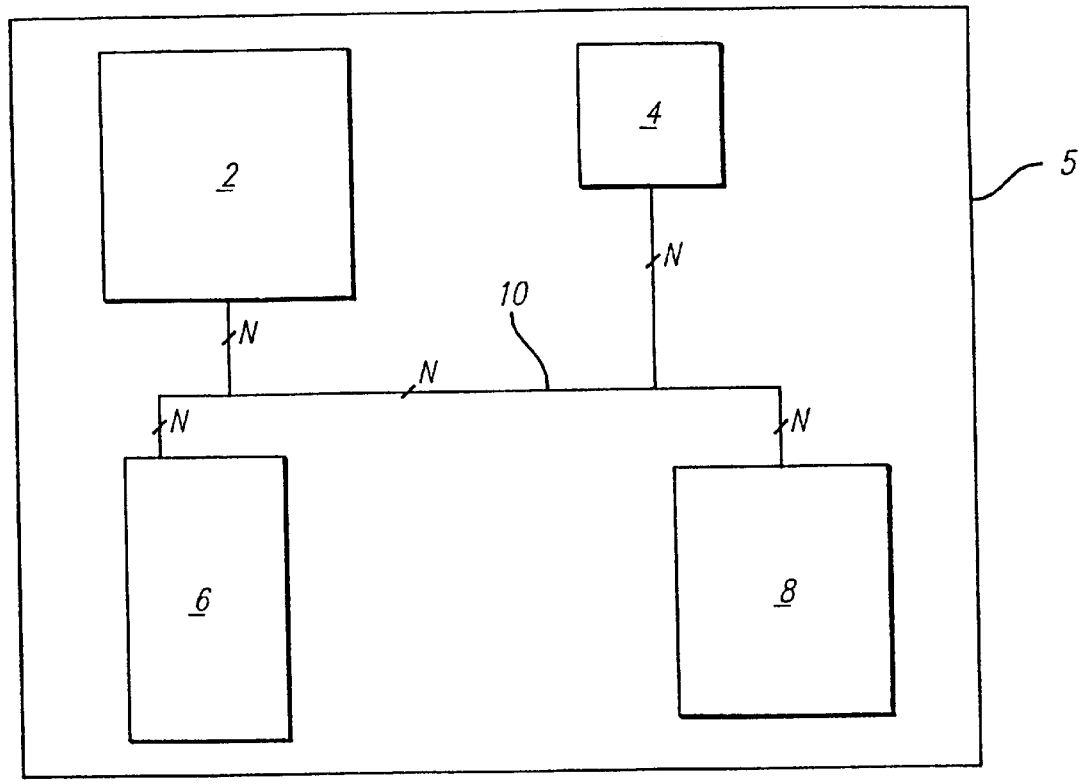
FIG. 1 illustrates a prior art multidirectional data bus for transmitting data signals between internal units of an integrated circuit.

Referring first to FIG. 1, a prior art multidirectional data bus 10 for transmitting data signals between internal units of an integrated circuit 5 is illustrated. The integrated circuit 5 contains various internal units, such as an instruction decode unit 2, a floating point unit 4, a memory management unit 6, and a graphics unit 8. It should be apparent that numerous other types and configurations of internal units and data bus interconnection are possible. The data bus 10 is N bits wide, such as thirty-two bits wide, and enables communication between any of the internal units of the integrated circuit 5. For example, one type of instruction operation may require the instruction decode unit 2 to communicate with the memory management unit 6. In another type of instruction operation, the memory management unit 6 may send a signal to both the floating point unit 4 and the graphics unit 8. Thus, control over signal routing and timing can be rather complex.

The prior art data bus 10 typically has a very large capacitive load. Each of the internal units must drive the entire capacitance of the data bus 10 every time it communicates with any of the other internal units, requiring a relatively large amount of AC power. As noted above, the data bus 10 cannot be subdivided easily using unidirectional repeater techniques to provide isolation and amplification functions due to its multidirectional nature.

Figure 2:
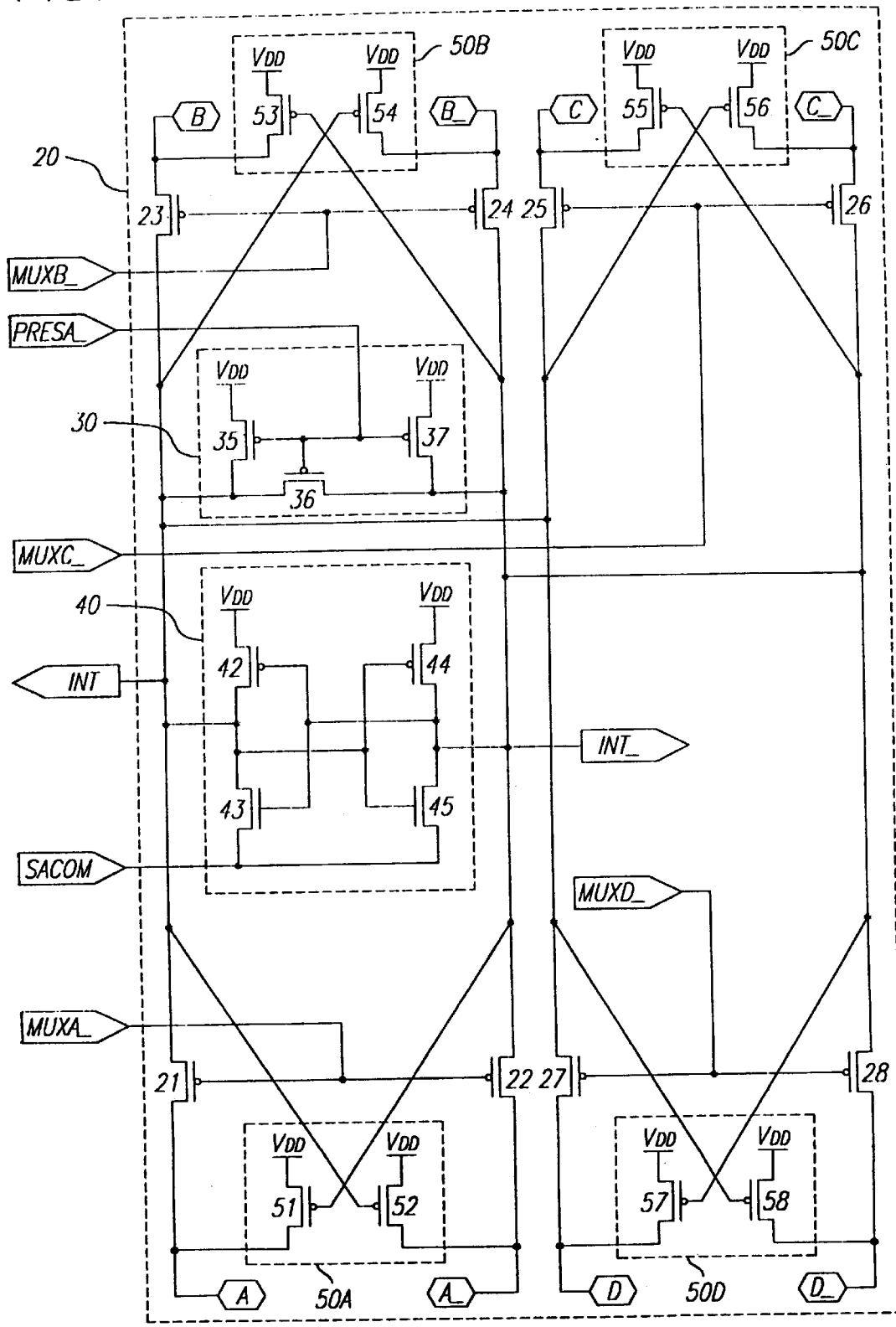
FIG. 2 is a schematic drawing of a multidirectional signal transfer circuit of the present invention.

Turning now to FIG. 2, a multidirectional signal transfer circuit 20 of the present invention is illustrated in schematic form. A plurality of differential signal transfer terminal pairs are provided and designated with reference letters: A, A__; B, B__; C, C__ and D, D__. As will be apparent from the description that follows, each of the differential signal transfer terminal pairs are capable of sending and receiving a differential signal to at least one other differential signal transfer terminal pair. A greater or lesser number of differential signal transfer terminal pairs are also possible, with four such terminal pairs illustrated merely for simplicity.

In the present invention, the differential signal is defined with a bias voltage level at $V_{DD}$, such as on the order of 300 millivolts relative to a 3.3 volt CMOS $V_{DD}$ full rail voltage level, with a first data state being represented by a first polarity differential and a second data state being represented by an opposite polarity differential. For example, a data signal having a first data state applied to the terminals A, A__ would comprise a 3.3 volt $V_{DD}$ full rail voltage level applied to terminal A and a 3.0 volt level applied to terminal A__, with a positive differential between the terminals of 300 millivolts. Conversely, a data signal having a second data state would comprise a 3.3 volt $V_{DD}$ full rail voltage level applied to terminal A__ and a 3.0 volt level applied to terminal A. It should be apparent that alternative differential values and bias voltage levels are also possible, and further that the bias voltage can be at $V_{SS}$ as opposed to $V_{DD}$. The use of $V_{DD}$ as a bias voltage is advantageous in that it simplifies precharging and equalization of the data lines.

The respective terminals of the differential signal terminal pairs are each coupled to an associated isolation device. More particularly, transfer terminal A is coupled to isolation device 21 and transfer terminal A__ is coupled to isolation device 22; terminals B, B__ are coupled to isolation devices 23, 24, respectively; terminals C, C__ are coupled to isolation devices 25, 26, respectively; and, terminals D, D__ are coupled to isolation devices 27, 28, respectively. Each individual isolation device 21–28 comprises a p-channel FET device functioning as an isolation gate between the associated transfer terminal and one of a pair of internal nodes INT, INT__, with the drains of each respective isolation device coupled to an associated one of the transfer terminals and the sources of each respective isolation device coupled to a respective one of the internal nodes.

The gates of respective pairs of the isolation devices 21–28 are coupled together and also to a control signal input terminal for controlling the state of the paired devices. More specifically, isolation device pairs 21, 22 are adapted to receive a control signal termed MUXA__. Similarly, paired isolation devices 23, 24 are adapted to receive control signal MUXB__; isolation devices 25, 26 are adapted to receive control signal MUXC__; and, isolation devices 27, 28 are adapted to receive control signal MUXD__. As known in the art, the control signals MUXA__, MUXB__, MUXC__ and MUXD__ are provided by an external control circuit.

An internal precharge circuit 30 comprising three p-channel FET devices 35–37 is coupled between the internal nodes INT, INT__ and to device supply voltage $V_{DD}$. Each of the devices 35–37 has a commonly coupled gate that is adapted to receive a precharge control signal termed PRESA__. The sources of the devices 35 and 37 are commonly coupled to $V_{DD}$. The drains of the devices 35 and 37 are each coupled to a respective one of the internal nodes INT, INT__, and also to one of the source and drain of the device 36.

A cross-coupled differential amplifier circuit 40 comprising p-channel devices 42, 44, and n-channel devices 43, 45 is also coupled between the internal nodes INT, INT__. The sources of the devices 42, 44 are commonly coupled to $V_{DD}$. The drain of the device 42 is coupled to the internal node INT, to the commonly coupled gates of the devices 44, 45, and to the drain of the device 43. Similarly, the drain of the device 44 is coupled to the internal node INT__, to the commonly coupled gates of the devices 42, 43, and to the drain of the device 45. The sources of the devices 43, 45 are commonly coupled together and adapted to receive an amplifier control signal termed SACOM.

Figure 5:
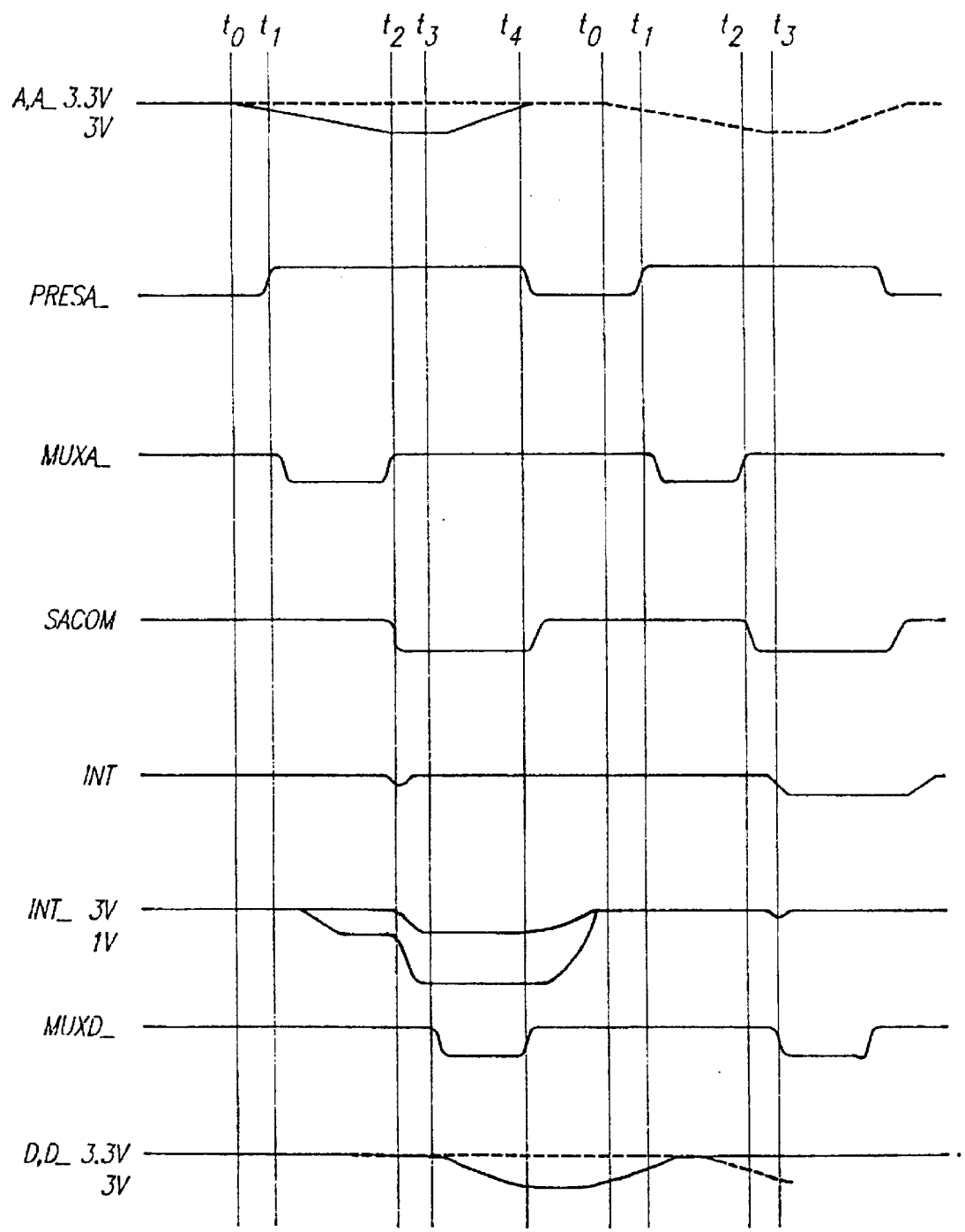
FIG. 5 is a diagram illustrating timing signals used to control an individual multidirectional signal transfer circuit.

Operation of the multidirectional signal transfer circuit 20 of FIG. 2 will now be described with reference to the timing diagram of FIG. 5. Before time $t_0$, the internal nodes INT, INT__ and transfer terminals A, A__ through D, D__ are precharged and equalized at the device voltage level VDD__. The internal nodes INT, INT__ are precharged by application of the PRESA__ control signal. The PRESA__ control signal is at a low value (i.e, $V_{SS}$) that causes each of the p-channel devices 35–37 to conduct, coupling the internal nodes INT and INT__ to V__, through the devices 35 and 37, respectively. The device 36 serves to equalize the voltage level on each of the internal nodes INT and INT__. The precharging of the transfer terminals A, A__ through D, D__ will be described in greater detail below.

Initially, all of the isolation devices 21–28 are disabled (i.e., in a non-conducting state) to isolate the transfer terminals from the internal nodes INT, INT__, and the multidirectional signal transfer circuit 20 is ready to transmit a signal between two or more of the signal transfer terminals. For exemplary purposes, a differential signal transferred between transfer terminals A, A__ and D, D__ will be described, though it should be apparent that a signal can also be transferred between any of the other transfer terminals by the same process, such as from D, D__ to A, A__.

At time $t_0$, a differential input signal arrives at the transfer terminals A, A__, which causes the voltage at one of the transfer terminals A or A__ (depending on the data state of the differential signal present on the transfer terminal pair) to begin to drop from $V_{DD}$. For purposes of this explanation, the voltage at the transfer terminal A__ drops relative to $V_{DD}$, representing a first data state or a "1" (in contrast to a "0" obtained by a voltage drop at the transfer terminal A). As illustrated in FIG. 5, the voltage at terminal A__ begins to drop from $V_{DD}$ to a voltage level below $V_{DD}$.

At time $t_1$, the internal node precharge circuit 30 is turned off by disabling the PRESA__ control signal, returning devices 35–37 to a non-conductive state. At approximately the same time, or slightly afterward, the isolation devices 21, 22 are enabled by the application of a negative voltage on the MUXA__ control signal. This allows the differential signal on the transfer terminals A, A__ to propagate into the internal nodes INT, INT__, causing the voltage at the internal node INT__ associated with the transfer terminal A__ to similarly drop from $V_{DD}$. Since there is virtually no capacitive load on the internal nodes INT, INT__, except for the internal capacitance of the FET devices of the differential amplifier circuit 40, the drop in voltage is particularly abrupt.

Ideally, the timing of $t_1$ should occur simultaneously with the timing of $t_0$. If the isolation devices 21, 22 are enabled early (before time $t_0$), there will be no differential signal at the transfer terminal, and the internal nodes INT, INT__ will not be affected. This does not create a problem for the multidirectional signal transfer circuit 20, but in practice it may be difficult to generate the timing signals in this sequence. Conversely, there may be no time delay penalty associated with late enabling of the isolation devices 21, 22 because the internal nodes INT, INT__ will quickly charge share with the transfer terminals A, A__ when the isolation devices are enabled. As a result, the final voltage levels at the internal nodes INT, INT__ necessary for reliable voltage sensing can be reached in the same amount of time whether the isolation devices are enabled precisely at time $t_0$, or slightly before or after time $t_0$.

At time $t_2$, after a delay determined by the minimum time required for the differential signal between the internal nodes INT, INT__ to reach the desired differential value (one to two nanoseconds for a three hundred millivolt transition with a one picofared line capacitance), the differential signal amplifier circuit 40 is enabled by a negative transition of the SACOM control signal to a low value (i.e., $V_{SS}$). The minimum desired differential value at the internal nodes INT, INT__ is determined by the need to overcome device mismatches as well as internal noise of the integrated circuit during operation. Since the internal nodes INT, INT__ were precharged to $V_{DD}$, both of the n-channel devices 43, 45 are quickly driven to a conductive state at the time the SACOM control signal is applied due to the small differential voltage at INT, INT__ and the fast fall time of the SACOM control signal. Application of the SACOM control signal starts pulling both INT and INT__ toward $V_{SS}$ through the n-channel devices 43, 45. The lower beginning voltage level at the internal node INT__ relative to INT causes the voltage at INT__ to continue to drop faster than the voltage at INT, further causing the p-channel device 42 to become conductive and the n-channel device 43 to start shutting off. This causes the voltage at the internal node INT to rise quickly back toward $V_{DD}$, keeping the p-channel device 44 non-conductive and reinforcing the rate at which the voltage at the internal node INT__ is pulled low. As a result, the differential signal between the transfer terminals A, A__ becomes amplified and latched onto the internal nodes INT, INT__.

At approximately the same time, before the voltage level on the internal node INT__ has fallen more than approximately 30% of the full $V_{DD}$ value (between 800 millivolts and 1 volt below $V_{DD}$), the isolation devices 21, 22 are turned off by disabling the MUXA__ control signal. The rate at which the voltage level on the internal node INT__ drops is increased by the isolation of the internal nodes INT, INT__ from the terminals A, A__ by the turning off of the isolation devices 21, 22. Therefore, MUXA__ can be deselected even before SACOM begins to fall, with the only drawback being the possible incomplete sampling of the full differential signal on A, A__. Shortly thereafter, at time $t_3$, the isolation devices 27, 28 at transfer terminals D, D__ are turned on by application of the MUXD__ control signal. The delay time between application of the SACOM control signal at time $t_2$ and the MUXD__ control signal at time $t_3$ permits a relatively large differential voltage to develop at the internal nodes INT, INT__ without being affected by charge sharing with the transfer terminals D, D__.

The drop of the voltage level on the internal node INT__ is then simultaneously arrested and reversed slightly by charge sharing between the internal node INT__ and the precharged terminal D__ as the isolation devices 27, 28 are enabled by application of the MUXD__ control signal. The relatively large differential voltage at the internal nodes INT, INT__ quickly transitions to a small differential voltage (300–500 millivolts) at the terminals D, D__ since the capacitance on the terminals D, D__ is much greater than the capacitance of the internal nodes INT, INT__. The differential voltage on terminals D, D__ would be sufficient for sensing by a follow-on circuit, such as another multidirectional signal transfer circuit 20.

Finally, at time $t_4$, the isolation devices 27, 28 are turned off by disabling the MUXD__ control signal. A sufficient differential signal has now completed its transfer to the D, D__ transfer terminals, and the internal nodes INT, INT__ are again isolated from the D, D__ transfer terminals. The multidirectional signal transfer circuit 20 then readies itself to begin the transfer process again by precharging the internal nodes INT, INT__ to device voltage level $V_{DD}$ by application of the PRESA__ control signal. The SACOM control signal is also raised to the device voltage level $V_{DD}$ to turn off the differential signal amplifier circuit 40 and allow maximum precharging and equalizing of the internal nodes INT, INT__. Alternatively, the SACOM control signal may be raised to a voltage level below $V_{DD}$, such as $V_{DD}-V_T$ where $V_T$ is the threshold of the devices being used, at which the internal nodes INT, INT__ would equalize at the device voltage level $V_{DD}$ without current flowing in the n-channel devices 43 and 45.

The signal transfer circuit 20 is also capable of transferring a differential input signal to a plurality of transfer terminals simultaneously. In the above description, a differential signal can be transferred from the A, A__ transfer terminals to both the D, D__ terminals and the C, C__ terminals by applying the MUXC__ control signal to the isolation devices 25, 26 at time $t_3$, the same time that the MUXD__ control signal is applied to the isolation devices 27, 28. At time $t_4$, the isolation devices 25, 26 are turned off by disabling the MUXC__ control signal at the same time that the isolation devices 27, 28 are turned off by disabling the MUXD__ control signal. It should be apparent that the signal transfer circuit 20 can transfer the differential signal to any number of the transfer terminals in a similar manner. In the case of two or more transfer terminals being utilized as an output at the same time, the fixed amount of current that can be supplied by the differential amplifier circuit 40 will be shared by the enabled terminals. Thus, the amount of time between time $t_3$ and $t_4$ may be increased for the differential amplifier circuit 40 to drive the multiple output terminals. Alternatively, the differential amplifier circuit 40 may be constructed with larger than normal device sizes capable of providing higher output current levels.

The multidirectional signal transfer circuit 20 of FIG. 2 further comprises a plurality of gain enhancing circuits 50$_A$, 50$_B$, 50$_C$, and 50$_D$ coupled to respective ones of the transfer terminals (illustrated in conjunction with transfer terminals A, A__ through D, D__, respectively). More particularly, p-channel devices 51, 52 are cross-coupled to the transfer terminals A, A__; p-channel devices 53, 54 are cross-coupled to the transfer terminals B, B__; p-channel devices 55, 56 are cross-coupled to the transfer terminals C, C__; and, p-channel devices 57, 58 are cross-coupled to the transfer terminals D, D__. The devices 51, 52 have sources that are commonly coupled to $V_{DD}$. The device 51 has its drain coupled to A, and its gate coupled to INT__. Conversely, the device 52 has its drain coupled to A__, and its gate coupled to INT. Each of the other devices 53–58 of the gain enhancing circuits 50$_B$–50$_D$ are coupled to the respective transfer terminals in a like manner.

The gain enhancing circuits 50 operate during the time that the differential signal amplifier circuit 40 is operating. The gain enhancing circuits 50 are necessary to minimize undesired voltage droop of the high-remaining output transfer terminal (in the above example, transfer terminal D) which should ideally remain at $V_{DD}$. Ideally, the low side output transfer terminal (D__) will slew as quickly as possible while the high side output transfer terminal (D) remains solid at $V_{DD}$. In practice, however, the voltage at the high side internal node unavoidably droops slightly before pulling back to $V_{DD}$. In order to minimize the transfer of this unwanted droop from the internal node to the output transfer terminal, the most effective drain connections for the gain enhancing p-channel devices 57, 58 is directly to the output transfer terminals D, D__. It should be apparent to those skilled in the art that this connection on all of the transfer terminals will have the most positive effect on the output transfer terminals, while causing no adverse effects on the input transfer terminals (A, A__) and the unused transfer terminals (B, B__, C, C__).

While an input signal is typically transferred through the multidirectional signal transfer circuit 20 from one pair of transfer terminals to one or more other pairs of transfer terminals, the input signal could merely return to the original pair of transfer terminals for use as a local amplifier. For example, a small differential signal sensed at the A, A__ transfer terminals could be permitted to propagate through the isolation devices 21, 22 to the internal nodes INT, INT__ for amplification by the differential signal amplifier circuit 40, without disabling the isolation devices 21, 22. The multidirectional signal transfer circuit 20 would then merely amplify or reinforce the differential signal on the transfer terminals A, A__, or could be used to modify the level of the differential signal. The isolation devices 21, 22 would be disabled only after a desired differential voltage is achieved and propagated through the isolation devices.

In alternative embodiments of the present invention, the repeater circuit can be configured to operate as a small signal receiver or transmitter. A small signal receiver receives a differential voltage input signal and generates a full rail voltage representative signal. Small signal receivers of this type are useful, for example, at the final stage of a series of repeaters. At some point, the small signal must be converted to a large voltage swing. In a data read operation, the small signal of a RAM device memory cell that is transmitted by successive repeater stages must ultimately be converted to a full rail voltage output signal.

A small signal transmitter is the inverse of a small signal receiver, and receives a full rail voltage input signal and generates a differential voltage output. These would be used at the beginning of the successive repeater stages. In a data write operation, a full rail voltage input signal is converted to a high speed small signal differential signal for long distance transfer across the integrated circuit chip at minimum power expenditure. In such a case, there would be small signal repeater stages, with a final receiver stage to convert the small signal back to full rail signals.

The multidirectional signal transfer circuit 20 of FIG. 2 can be configured to operate as a small signal receiver by controlling the timing of the enabling of the isolation devices. For example, the A, A__ transfer terminals of the multidirectional signal transfer circuit 20 can provide an input for the differential voltage signal, and the terminal D can provide an output (terminal D__ may or may not be used). As described above, the internal nodes INT, INT__ would be precharged, the differential signal amplifier 40 would be enabled by application of the SACOM control signal, and the isolation devices 21, 22 would be enabled, permitting the differential input signal to propagate to the internal nodes. Rather than turning off the isolation devices 21, 22 simultaneously with the turning on of the isolation devices 27, 28, however, the isolation devices 27, 28 remain off for a longer period of time to allow the voltage at the INT and INT__ internal nodes to reach levels closer to the power supply rails $V_{DD}$ and $V_{SS}$. At this point, the isolation devices 27 and/or 28 could be enabled for a short time to allow the large signal to propagate to the lightly loaded output node D (and/or D__). The terminal D may not need to be precharged.

Figure 7:
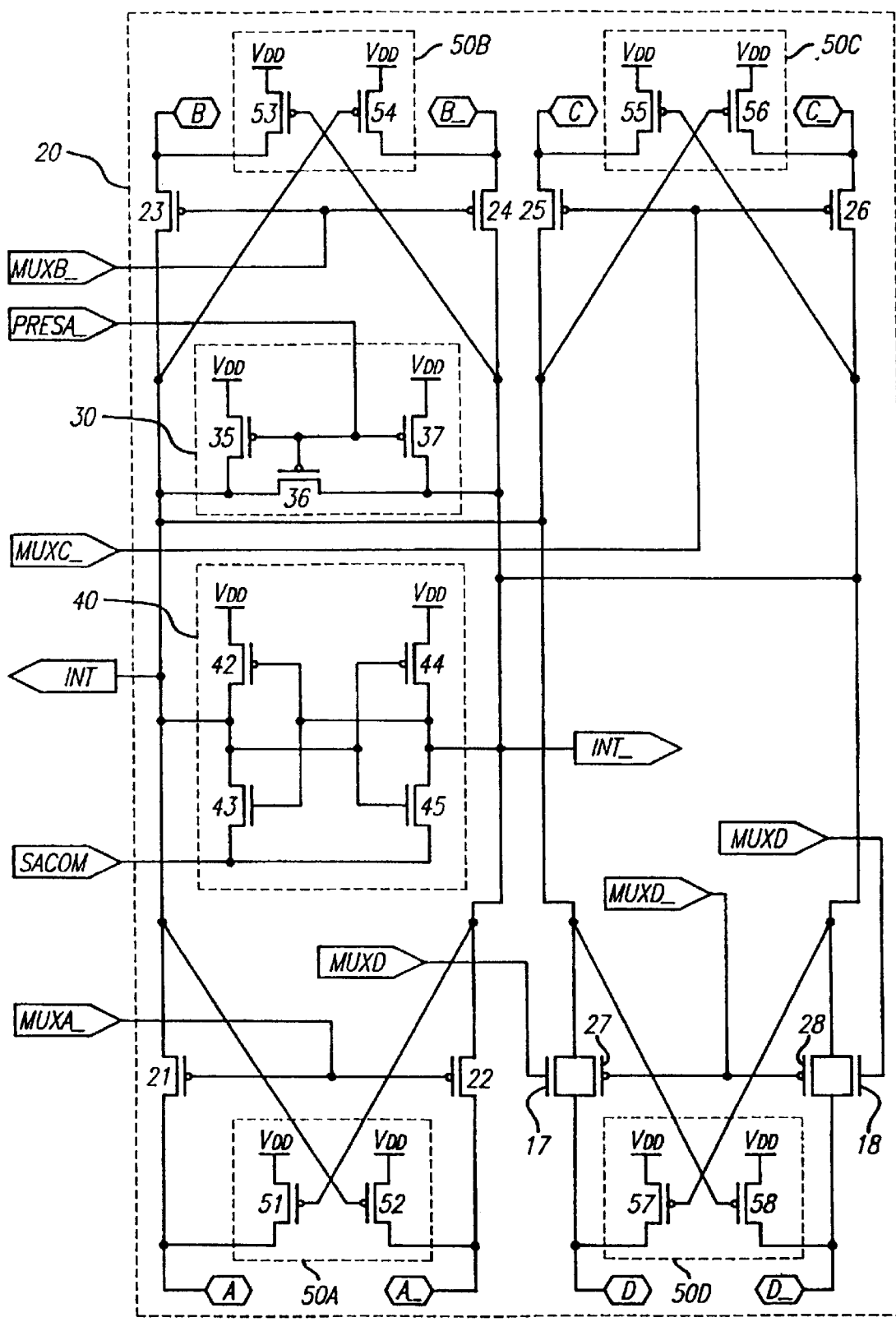
FIG. 7 is a schematic drawing of a multidirectional signal transfer circuit configured to receive a differential signal input and produce a single full rail output.

If the nature of the output bus requires a full rail output signal, opposite polarity devices 17, 18 are coupled across the isolation devices 27, 28, respectively, as illustrated in FIG. 7. The gate control of these devices 17, 18 can be generated simply as the inversion of the MUXD__ control signal (termed MUXD). Whenever the p-channel devices 27, 28 are enabled, the n-channel devices 17, 18 would be enabled as well.

Assuming that the differential input signal represents a data "0" the voltage at terminal A will be a differential below $V_{DD}$. After the isolation devices 21, 22 have turned off, the voltage on the INT internal node will continue to fall toward $V_{SS}$. Once an adequate level is reached, the isolation device 27 can be enabled to then provide a full rail $V_{SS}$ output. Conversely, if the differential input signal represents a data "1" the voltage at terminal A will be near $V_{DD}$, and the differential amplifier will latch at that value to provide a full rail $V_{DD}$ output.

The multidirectional signal transfer circuit 20 of FIG. 2 can also be configured to operate as a small signal transmitter by controlling the timing of the enabling of the isolation devices. In this example, the A transfer terminal of the multidirectional signal transfer circuit 20 can provide an input for the full rail voltage signal (terminal A__ may not need to be used), and terminals D, D__ can provide a differential voltage output. As in the small signal receiver, the internal nodes INT, INT__ would be precharged, the isolation device 21 would be enabled, and the differential signal amplifier 40 would be enabled by application of the SACOM control signal, permitting the full rail voltage signal to be latched onto the internal nodes. The amount of differential signal on the output transfer terminals D, D__ would be controlled by the pulse width of the MUXD__ signal. The slew rate on the output transfer terminals D, D__ is determined by the parasitic capacitance on the ouput transfer terminals D, D__.

Assuming that the full rail input signal represents a data "0" the voltage at terminal A will be $V_{SS}$. When the SACOM control signal falls, the full rail signal will latch onto the internal nodes INT, INT__. Then, a small differential output signal would appear at the output transfer terminals D, D__. Conversely, if the full rail input signal represents a data "1" the voltage at terminal A will be $V_{DD}$, and when the SACOM control signal falls, the opposite full rail signal will latch onto the internal nodes INT, INT__. Then, an opposite differential output signal would appear at to the output transfer terminals D, D__.

Figure 3:
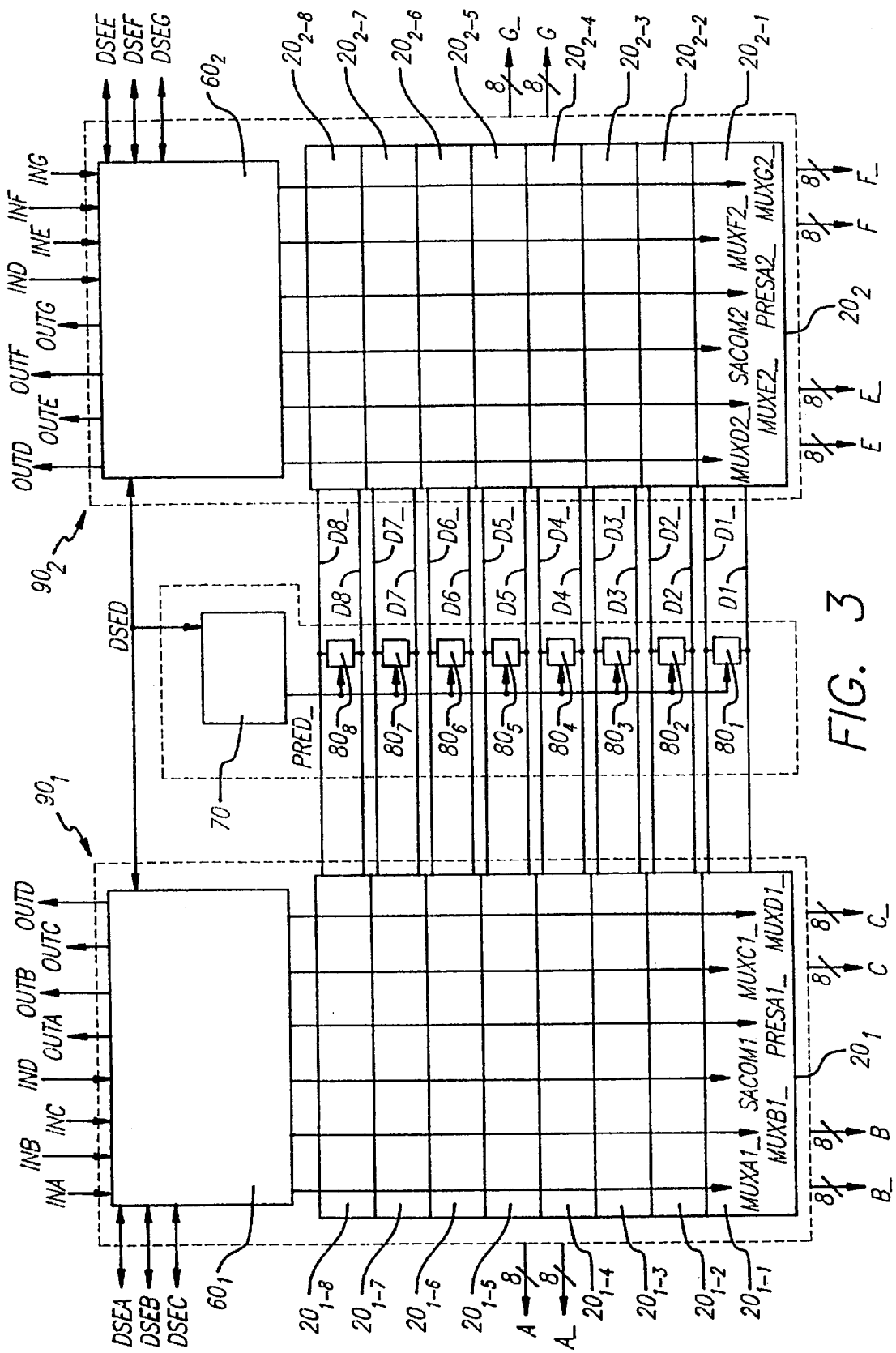
FIG. 3 is a schematic drawing of a data bus having a plurality of multidirectional signal transfer circuits used to couple between internal units of an integrated circuit.

Referring now to FIG. 3, a portion of a data bus having two eight-bit signal transfer circuits $20_1$ and $20_2$ is illustrated. Each of the signal transfer circuits $20_1$, $20_2$ has eight substantially identical circuits (identified as $20_{1-1}$ through $20_{1-8}$ and $20_{2-1}$ through $20_{2-8}$) to transfer data signals on each respective data line pair of an eight data line bus. The individual elements each correspond to the multidirectional signal transfer circuit 20 discussed above with respect to FIG. 2. The signal transfer circuit $20_1$ has transfer terminal pairs A, A__, B, B__, C, C__ and D, D__ for communication with data bus segments A, B, C, and D, respectively. Similarly, the signal transfer circuit $20_2$ has transfer terminal pairs D, D__, E, E__, F, F__ and G, G__ for communication with data bus segments D, E, F, and G, respectively. Accordingly, the signal transfer circuit $20_1$ communicates with the signal transfer circuit $20_2$ along the D data bus segment, which includes eight data line pairs identified as D1, D1__ through D8, D8__. Though only two eight-bit signal transfer circuits are illustrated, it should be apparent that a greater number of such circuits could be advantageously utilized.

The signal transfer circuits $20_1$, $20_2$ are combined with respective control circuits $60_1$, $60_2$, to provide repeater circuits $90_1$, $90_2$. The control circuits $60_1$, $60_2$ receive external control signals that determine the routing of data signals along the entire data bus, and provide the timing signals necessary to control the operation of the particular signal transfer circuits $20_1$, $20_2$. For purposes of simplicity, the control circuit $60_1$ will be described in conjunction with the operation and control of signal transfer circuit $20_1$, though it should be apparent that both the control circuits $60_1$, $60_2$ operate in a similar manner.

The control circuit $60_1$ receives four input routing control signals termed INA, INB, INC, and IND and provides four output routing control signals termed OUTA, OUTB, OUTC, and OUTD. The input routing control signals define the data bus segment from which data is to be received into the signal transfer circuit $20_1$, and the output routing control signals define the data bus segment or segments onto which data is to be transmitted from the signal transfer circuit. For example, the INA and OUTD control signals will be set to a high value for data signals received on the A data bus segment and transmitted on the D data bus segment, respectively (as in the description above with respect to FIG. 2). These input and output routing control signals can be changed at any time. For example, a four cycle read operation followed by an eight cycle write operation might be executed by first enabling INA and OUTD for four cycles followed by enabling IND, OUTB for the next eight cycles.

In addition, the control circuit $60_1$ receives/transmits four bidirectional control signals termed DSEA, DSEB, DSEC and DSED. These bidirectional signals are routed between each respective control circuit and function to initiate the timing sequence of the recipient signal transfer circuit. Preferably, the bidirectional control signals operate as a single pulse for each cycle. For example, the DSED signal will be transmitted to initiate transfer of data signals on the D data bus segment between the signal transfer circuits $20_1$ and $20_2$. DSED is used for timing control in both directions of data flow. It depends on the states $IND_1$, $IND_2$, $OUTD_1$, and $OUTD_2$. The control circuit $60_2$ receives four input control signals termed IND, INE, INF, and ING and four output control signals termed OUTD, OUTE, OUTF, and OUTG, and also receives/transmits four bidirectional signals termed DSED, DSEE, DSEF and DSEG which function in a similar manner as the control signals associated with the control circuit $60_1$.

The control circuit $60_1$ also provides timing control signals to the associated signal transfer circuit $20_1$, including MUXA1__, MUXB1__, MUXC1__, MUXD1__, SACOM1 and PRESA1__. Similarly, the control circuit $60_2$ provides timing control signals to the associated signal transfer circuit $20_2$, including MUXD2__, MUXE2__, MUXF2__, MUXG2__, SACOM2 and PRESA2__. These timing control signals correspond respectively to the MUXA__, MUXB__, MUXC__, MUXD__, SACOM and PRESA__ control signals discussed above with respect to FIG. 2. The control circuit $60_1$ provides the timing control signals to all the signal transfer circuit elements $20_{1-1}$ through $20_{1-8}$ simultaneously so that the elements of the signal transfer circuit $20_1$ are synchronized together.

A data line precharge control circuit 70 is provided to control the timing of the precharge cycle applied to the data line pairs D1, D1__ through D8, D8__. The data line precharge control circuit 70 receives the bidirectional DSED control signal associated with the D data bus segment, and generates a precharge control signal termed PRED__ that is provided to each of a plurality of precharge driver circuits $80_1$ through $80_8$ associated with the respective data line pairs D1, D1__ through D8, D8__. Similarly, a corresponding data line precharge control circuit (not shown) is provided for each of the other data bus segments (A through C, and E through G), and receives the bidirectional control signal for that bus segment and generates a precharge control signal in like manner. For example, a data line control circuit associated with the E data bus segment would receive the DSEE control signal and generate the PREE__ precharge control signal.

Figure 4:
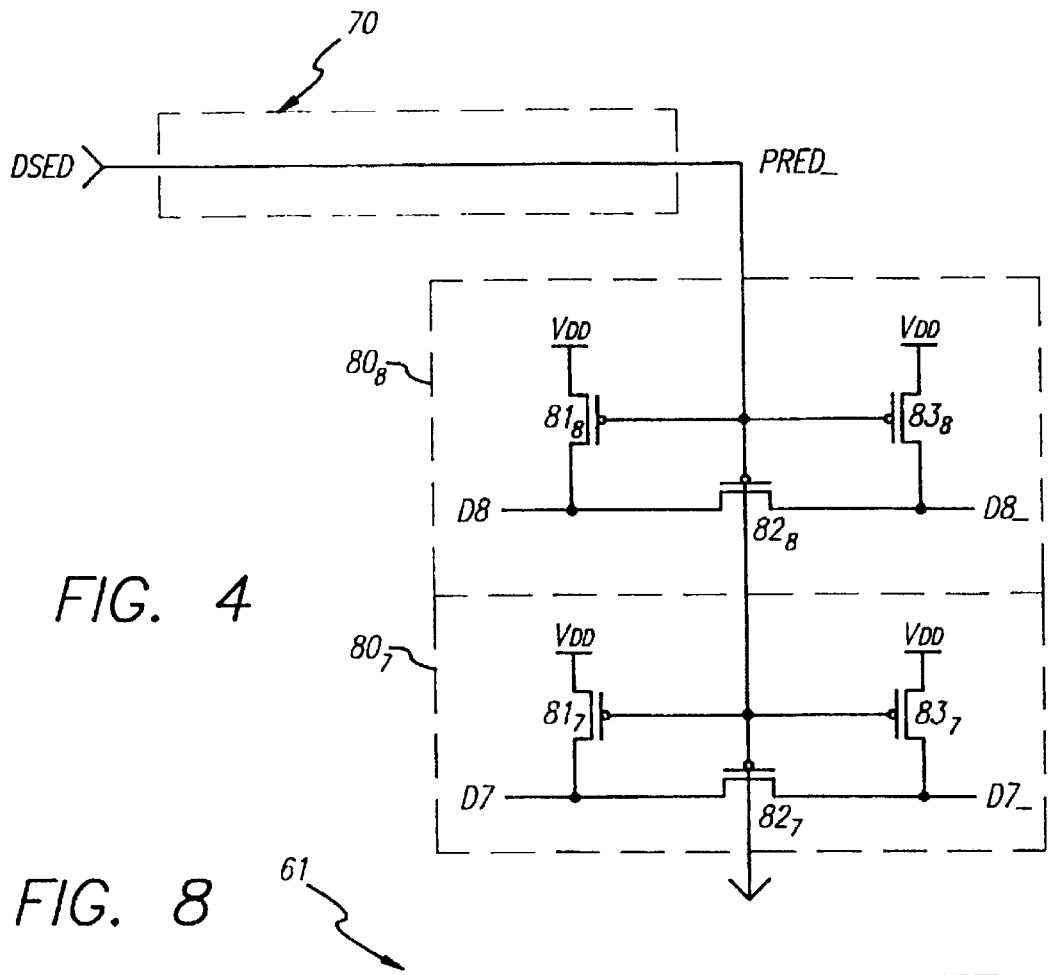
FIG. 4 is a schematic drawing of a transfer terminal precharge circuit for use with the multidirectional signal transfer circuit.

FIG. 4 illustrates in schematic form the data line precharge control circuit 70 and precharge driver circuits $80_7$, $80_8$ of FIG. 3. The data line precharge control circuit 70 introduces a time delay to the DSED signal, so that the PRED__ signal is delayed in time by a finite amount. The precharge driver circuits $80_7$, $80_8$ each comprise three p-channel FET devices 81–83 coupled between individual data lines of the data line pairs D1, D1__ through D8, D8__. In FIG. 4, the precharge driver circuits $80_8$ and $80_7$ are illustrated in association with data line pairs D8, D8__ and D7, D7__, respectively, though a corresponding precharge driver circuit is associated with each of the other data line pairs D1, D1__ through D6, D6__. Within the precharge driver circuit $80_8$, the sources of devices $81_8$ and $83_8$ are commonly coupled to $V_{DD}$. The drains of devices $81_8$ and $83_8$ are coupled to a respective one of the data lines D8, D8__, and also to one of the source and drain of the device $82_8$. Each of the devices $81_8$–$83_8$ has a commonly coupled gate, which is also commonly coupled to the gates of the precharge driver circuits $80_1$ through $80_7$, that receives the precharge control signal PRED__.

During operation of the data bus segment D of FIG. 3, the DSED control signal is transmitted between the control circuits $60_1$ and $60_2$ to initiate the transfer of data along the data bus segment. The timing of the control signal PRED__ is determined by delay introduced by the precharge control circuit 70, which provides a carefully timed delay from the DSED signal. The amount of this delay must be independently tuned for each of the two transitions of DSED. The negative transition of PRED__ enables the devices of the precharge driver circuits $80_1$–$80_8$, and is required to occur as soon as possible after the D, D__ terminal isolation devices of the signal transfer circuit $20_2$ have turned off, such that the equalization of the data lines will not adversely affect the sensing operation. The positive transition of the PRED__ signal disables the devices of the precharge driver circuits $80_1$–$80_8$, and must occur as late as possible just prior to the enabling of the D, D__ terminal isolation devices of the signal transfer circuit $20_1$, which is the beginning of signal generation on the data lines.

Figure 6:
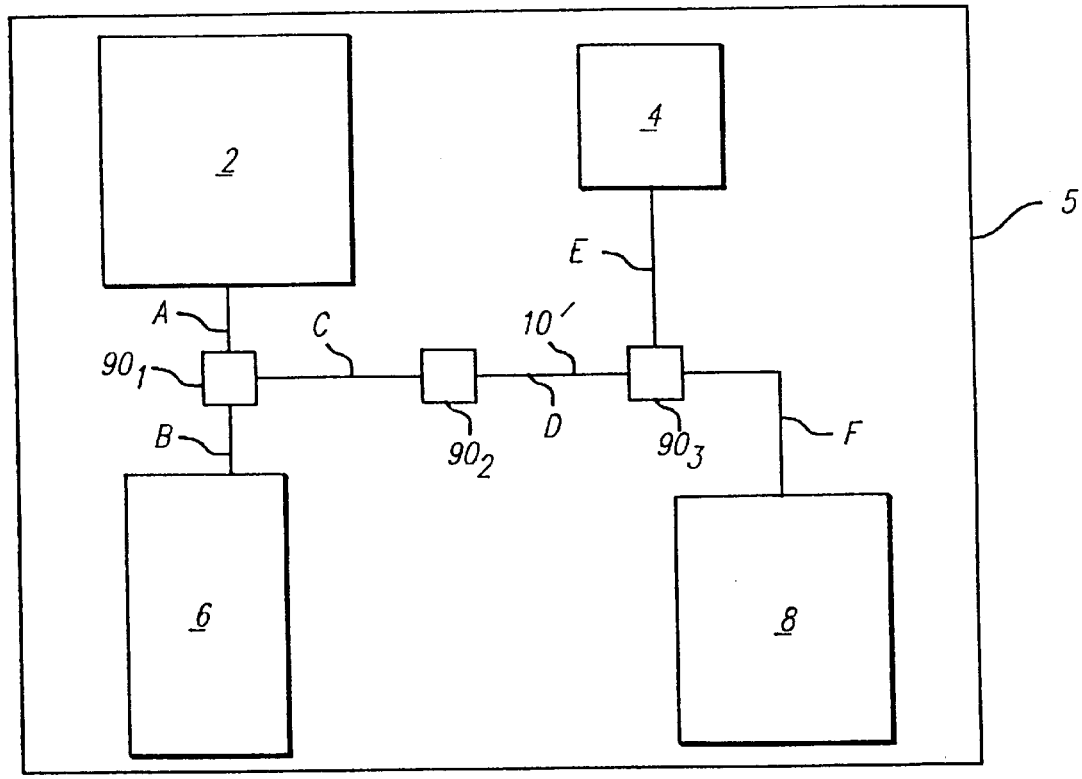
FIG. 6 illustrates a multidirectional data bus as in FIG. 1, including a plurality of the multidirectional signal transfer circuits for transmitting data signals between the internal units of an integrated circuit.

Referring now to FIG. 6, a bidirectional data bus 10' is provided with a plurality of repeater circuits $90_1$–$90_3$ for transmitting data signals between internal units of an integrated circuit 5. The data bus 10' is partitioned into data bus segments A, B, C, D, E and F. The integrated circuit 5 contains various internal units, such as an instruction decode unit 2, a floating point unit 4, a memory management unit 6, and a graphics unit 8, as described above with respect to FIG. 1. The repeater circuit $90_1$ permits signal transfer between data bus segments A, B, and C, which route signals to/from the instruction decode unit 2 and the memory management unit 6. The repeater circuit $90_2$ permits signal transfer between data bus segments C and D, which divides the bus 10' approximately in half. Finally, the repeater circuit $90_3$ permits signal transfer between data bus segments D, E, and F, which route signals to/from the floating point unit 4 and the graphics unit 8. It should be appreciated that numerous alternative configurations of internal units and repeater circuits 90 are contemplated.

The repeater circuit of the present invention provides numerous advantageous over the prior art. The circuit configuration and operation allows high speed transfer of data signals at greatly reduced power levels. Moreover, it provides capacitive isolation between the data bus segments, further improving the speed of data transfer. Lastly, the circuit configuration allows the use of multiple input ports and multiple output terminals (one or more of which can be driven at the same time). Any terminal can be either an input or an output at any given time, depending on the direction of data or address routing. With this configuration flexibility, the repeater circuit can be used to route signals in different directions at different times. For example, the repeater circuit can be coupled to the same input bus for both address information and data. When acquiring address information, the output terminals that connect to the address predecoders would be enabled, while disabling the outputs to the data writing circuitry. During a data write operation, the outputs to the data writing circuitry would be enabled, and the outputs to the address predecoders would be disabled.

Figure 8:
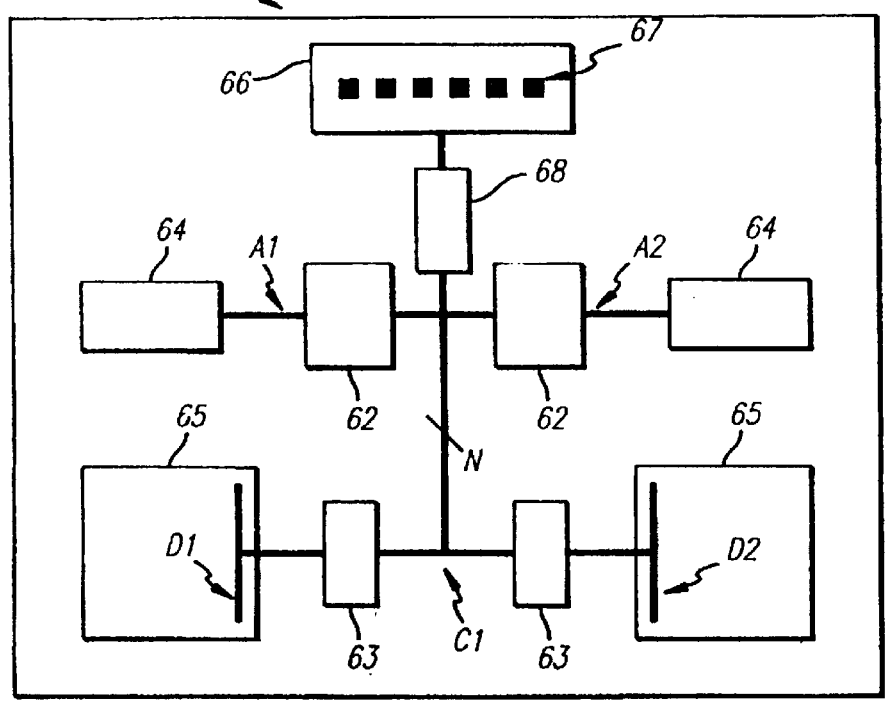
FIG. 8 illustrates an alternative embodiment of a data bus including a plurality of multidirectional signal transfer circuits configured as repeaters, transmitters and receivers connected to a single common bus.

FIG. 8 illustrates an alternative embodiment of the present invention, directed toward situations where a smaller N-bit central bus needs to communicate with several different circuit blocks on an integrated circuit chip 61 and the central bus may not need to be subdivided for speed improvement. In this embodiment, the circuit elements 90 are configured as signal transceivers 62, 63, 68 located on a central bus C1. A transceiver can function as a transmitter, receiver or repeater. In FIG. 8, the integrated circuit 61 could be a memory chip with a protocol-based addressing scheme that allows address and data information to be communicated to and from the chip on a single common input/output (I/O) structure 66. This I/O structure 66 receives address and write data information from off the chip via bonding pads 67, and transmits read data off the chip via the bonding pads.

The interface between the common I/O structure 66 and the central bus C1 is a group of N circuit elements operated in both transmitter and receiver modes, depending on the direction of the data flow, or separate transmitter and receiver circuits each operating in a single direction. The transceiver circuit 68 acts as an interface between the central bus C1 and the I/O structure 66. The transceiver circuits 62 act as interfaces between the central bus C1 and local address buses A1 and A2. These N circuits sample the data on the central bus C1 only when address information is being transmitted on the bus C1, and pass this information onto the local address buses A1 and A2 via either small differential signals or large full rail signals. The address signals are then decoded by address circuitry 64 to select the proper location or locations in memory arrays 65. The repeater circuits 63 attached to the central bus C1 operate when data is either being written into memory arrays 65 or read from the memory arrays. The repeater circuits 63 could be operated in a small-signal bidirectional mode, in which a single repeater circuit could be utilized to transmit differential signals in both directions. If a full rail signal is necessary for a write operation on local data buses D1 and D2, then receiver circuits 63 could be used for data transfer in both directions. Transceiver circuits 63 could be configured as the multidirectional signal transfer circuit 20 of FIG. 7.

Having thus described a preferred embodiment of a multidirectional small signal transceiver/repeater, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. A signal transfer circuit for enabling transfer of electrical signals along at least one signal path, said circuit comprising:

first and second pairs of bidirectional signal transfer terminals;

a pair of internal nodes;

first and second pairs of isolation devices coupled between respective ones of said signal transfer terminal pairs and said internal nodes, said isolation devices each having a control terminal for receiving an isolation control signal; and a signal amplifier circuit coupled to said internal nodes, said amplifier circuit comprising a control terminal for receiving an amplifier control signal for enabling said amplifier circuit;

whereby a first differential signal applied to one of said pairs of signal transfer terminals is transferred to said internal nodes for amplification by said amplifier circuit, and after which the amplified signal on said internal nodes is transferred to at least one of said pairs of signal transfer terminals as a second small differential signal;

wherein the first differential signal comprises a first and a second signal whose levels are in a range from a first rail voltage to a second rail voltage; and wherein the second small differential signal comprises a third and a fourth signal whose levels are in the range from the first rail voltage to the second rail voltage and a difference between the levels of the third and fourth signals is substantially less than a difference between the first rail voltage and the second rail voltage.

2. The signal transfer circuit of claim 1 further comprising a precharge circuit coupled to said internal nodes and having a control terminal for receiving an internal precharge control signal.

3. The signal transfer circuit of claim 2 further comprising means for controlling timing of said internal precharge control signal.

4. The signal transfer circuit of claim 1 wherein said amplifier circuit comprises a cross-coupled latch circuit.

5. The signal transfer circuit of claim 1 further comprising at least one additional pair of signal transfer terminals and an associated pair of isolation devices coupled between respective ones of said at least one additional pair of signal transfer terminals and said internal nodes.

6. The signal transfer circuit of claim 5, wherein each isolation device of the pair of isolation devices associated with the additional pair of transfer terminals further comprises a control terminal for receiving an isolation control signal, wherein application of isolation control signals to each pair of isolation devices renders said signal transfer circuit multidirectional.

7. A signal transfer circuit for enabling transfer of electrical signals along at least one signal path, said circuit comprising:
   first and second pairs of bidirectional signal transfer terminals;
   a pair of internal nodes;
   first and second pairs of isolation devices of a single device type coupled between respective ones of said signal transfer terminal pairs and said internal nodes, said isolation devices each having a control terminal for receiving an isolation control signal;
   a signal amplifier circuit coupled to said internal nodes, said amplifier circuit comprising complementary device types and a control terminal for receiving an amplifier control signal for enabling said amplifier circuit; and
   a gain enhancing circuit associated with each respective one of said pairs of signal transfer terminals, said gain enhancing circuit comprising a cross-coupled pair of devices of a single device types;
   whereby a signal applied to one of said pairs of signal transfer terminals is transferred to said internal nodes for amplification by said amplifier circuit, and after which the amplified signal on said internal nodes is transferred to a different one of said pairs of signal transfer terminals.

8. The signal transfer circuit of claim 1, further comprising a precharge circuit coupled to at least one of said signal transfer terminals.

9. The signal transfer circuit of claim 1, wherein said signal transfer circuit is a signal repeater.

10. A data bus having at least one differential data line pair, comprising:
    first and second pairs of bidirectional signal transfer terminals;
    a first pair of internal nodes;
    first and second pairs of isolation devices coupled between respective ones of said signal transfer terminal pairs and said first pair of internal nodes, said isolation devices each having a control terminal for receiving an isolation control signal; and
    a first signal amplifier circuit coupled to said first pair of internal nodes, said first amplifier circuit comprising a control terminal for receiving an amplifier control signal for enabling said first amplifier circuit;
    third and fourth pairs of bidirectional signal transfer terminals;
    a second pair of internal nodes;
    third and fourth pairs of isolation devices coupled between respective ones of said signal transfer terminal pairs and said second pair of internal nodes, said isolation devices each having a control terminal for receiving an isolation control signal; and
    a second signal amplifier circuit coupled to said second pair of internal nodes, said second amplifier circuit comprising a control terminal for receiving an amplifier control signal for enabling said second amplifier circuit;
    wherein said second pair of signal transfer terminals is coupled to said third pair of signal transfer terminals through a differential data line pair;
    wherein a first differential signal applied to said first pair of signal transfer terminals is transferred to said first pair of internal nodes for amplification by said first amplifier circuit, after which the amplified signal on said first pair of internal nodes is transferred through said second pair of signal transfer terminals as a second differential signal onto said differential data line pair;
    wherein said second differential signal is transferred through said third pair of signal transfer terminals to said second pair of internal nodes for amplification by said second amplifier circuit, after which the amplified signal on said second pair of internal nodes is transferred to said fourth pair of signal transfer terminals as a third differential signal; and
    wherein the first, second and third differential signals each comprises a first and a second signal whose levels are in a range from a first rail voltage to a second rail voltage.

11. The signal transfer circuit of claim 1, wherein said signal transfer circuit is a transmitter.

12. The signal transfer circuit of claim 1, wherein said isolation devices comprise a single device type.

13. The signal transfer circuit of claim 1, further comprising means for controlling timing of said isolation control signals.

14. A signal transfer circuit for enabling transfer of electrical signals along at least one signal path, said circuit comprising:
    a plurality of pairs of bidirectional signal transfer terminals;
    a pair of internal nodes;
    means for isolating said internal nodes from respective ones of said signal transfer terminal pairs, said isolation means adapted to receive isolation control signals associated with each of said signal transfer terminal pairs to enable a first differential signal received at one of said signal transfer terminal pairs to propagate to said internal nodes and subsequently to at least one of said signal transfer terminal pairs as a second small differential signal;
    means for amplifying said signal at said internal nodes;
    means for controlling said means for amplifying;

wherein the first differential signal comprises a first and a second signal whose levels are in a range from a first rail voltage to a second rail voltage; and wherein the second small differential signal comprises a third and a fourth signal whose levels are between the first rail voltage and the second rail voltage and a difference between the levels of the third and fourth signals is substantially less than a difference between the first rail voltage and-the second rail voltage.

15. The signal transfer circuit of claim 14, further comprising means for precharging said internal nodes to a rail signal level.

16. The signal transfer circuit of claim 14, wherein said amplifying means comprises a cross-coupled differential amplifier circuit.

17. A signal transfer circuit for enabling transfer of electrical signals along at least one signal path, said circuit comprising:
  a plurality of pairs of bidirectional signal transfer terminals;
  a pair of internal nodes;
  means for isolating said internal nodes from respective ones of said signal transfer terminal pairs, said isolation means adapted to receive isolation control signals associated with each of said signal transfer terminal pairs to enable a signal received at one of said signal transfer terminal pairs to propagate to said internal nodes and subsequently to at least one of said signal transfer terminal pairs;
  means for amplifying said signal at said internal nodes;
  means for controlling said means for amplifying; and
  means for enhancing gain of said amplifying means associated with each respective one of said pairs of signal transfer terminals, said gain enhancing means comprising a cross-coupled pair of devices of a single device type.

18. The signal transfer circuit of claim 14, further including means for precharging said signal transfer terminals prior to receipt of an associated isolation control signal.

19. The signal transfer circuit of claim 14, wherein said signal transfer circuit is a small signal transmitter.

20. The signal transfer circuit of claim 14, wherein said isolating means comprises devices of a single device type.

21. The signal transfer circuit of claim 20, wherein said single device type comprises a p-channel transistor.

22. The signal transfer circuit of claim 14, wherein said amplifying means comprises devices of complementary device types.

23. A method for transferring differential signals between plural pairs of transfer terminals selectively isolated from plural internal nodes, comprising the steps of:
  propagating a first differential signal between a first pair of said transfer terminals and said internal nodes;
  latching the first differential signal onto the internal nodes;
  placing at least one pair of said transfer terminals in communication with said internal nodes to propagate said latched first differential signal from said internal nodes to said at least one pair of said transfer terminals as a second small differential signal;
  wherein the first differential signal comprises a first and a second signal whose levels are in a range from a first rail voltage to a second rail voltage; and
  wherein the second small differential signal comprises a third and a fourth signal whose levels are in the range from the first rail voltage to the second rail voltage and a difference between the levels of the third and fourth signals is substantially less than a difference between the first rail voltage and the second rail voltage.

24. The method of claim 23, further comprising the step of precharging said internal nodes to a rail signal level.

25. The method of claim 23, further comprising the step of maintaining substantially a rail signal level on one of said internal nodes during said latching step.

26. The method of claim 23, further comprising the step of precharging associated ones of said signal transfer terminals prior to one of said propagating and placing steps.

27. The method of claim 23, wherein said propagating step further comprises the step of sensing said first differential signal at said first pair of transfer terminals.

28. The method of claim 23, further comprising the step of isolating said first pair of said transfer terminals.

29. The method of claim 24, wherein said latching step further comprises the step of isolating an input capacitance of said first pair of transfer terminals from said internal nodes.

30. The method of claim 23, wherein said first pair of transfer terminals remain in electrical contact with said internal nodes during said latching and placing steps.

31. The data bus of claim 10 wherein the second amplifier circuit comprises complementary device types.

32. The data bus of claim 10, further comprising a precharge circuit, wherein the differential data line pair is precharged by the precharge circuit before the transfer to it of said second differential signal.

33. The data bus of claim 10, wherein the amplifier circuit maintains a rail signal level on one of a pair of internal nodes during amplification.

34. The signal transfer circuit of claim 1, wherein at least one of said first and second pairs of signal transfer terminals is capable of serving as an input and an output for a single differential signal.

35. A circuit, comprising:
  a first port, wherein the first port is a pair of signal transfer terminals;
  a second port, wherein the second port is a pair of signal transfer terminals;
  a third port, wherein the third port is a pair of signal transfer terminals;
  a pair of internal nodes;
  a first port isolator coupled between the first port and the pair of internal nodes, wherein the first port isolator is controllable between a first state and a second state;
  a second port isolator coupled between the second port and the pair of internal nodes, wherein the second port isolator is controllable between a first state and a second state;
  a third port isolator coupled between the third port and the pair of internal nodes, wherein the third port isolator is controllable between a first state and a second state,
  an amplifier coupled between the pair of internal nodes;
  whereby a first differential signal applied to any one of said pairs of signal transfer terminals is transferred to said internal nodes for amplification by said amplifier circuit, and after which the amplified signal on said internal nodes is transferred to any of said pairs of transfer signal terminals as a second differential signal; and
  wherein the first and second differential signals each comprises a first and a second signal whose levels are in a range from a first rail voltage to a second rail voltage.

36. The circuit of claim 1 wherein the difference between the levels of the third and fourth signals is not greater than fifteen percent of the difference between the first rail voltage and the second rail voltage and wherein the difference between the third and fourth signal levels is of sufficient amplitude to be sensed.

37. The circuit of claim 14 wherein the difference between the levels of the third and fourth signals is not greater than fifteen percent of the difference between the first rail voltage and the second rail voltage and wherein the difference between the third and fourth signal levels is of sufficient amplitude to be sensed.

38. The method of claim 23 wherein the difference between the levels of the third and fourth signals is not greater than fifteen percent of the difference between the first rail voltage and the second rail voltage and wherein the difference between the third and fourth signal levels is of sufficient amplitude to be sensed.

39. The circuit of claim 1 wherein the first and second pairs of isolation devices are of a single device type.

40. The circuit of claim 1 wherein the amplifier circuit comprises complementary device types.

41. The data bus of claim 10 wherein the first and second pairs of isolation devices are of a single device type.

42. The data bus of claim 10 wherein the first amplifier circuit comprises complementary device types.

43. The data bus of claim 10 wherein the third and fourth pairs of isolation devices are of a single device type.

* * * * *